United States Patent [19]
Dent

[11] Patent Number: 5,241,702
[45] Date of Patent: Aug. 31, 1993

[54] D.C. OFFSET COMPENSATION IN A RADIO RECEIVER

[75] Inventor: Paul W. Dent, Stehag, Sweden

[73] Assignee: Telefonaktiebolaget L M Ericsson, Stockholm, Sweden

[21] Appl. No.: 578,251

[22] Filed: Sep. 6, 1990

[51] Int. Cl.[5] .......................... H04B 1/06; H04B 7/00
[52] U.S. Cl. ................................ 455/278.1; 455/296; 455/303; 455/304; 329/325
[58] Field of Search ............ 455/324, 295, 226, 278.1, 455/303, 304, 310, 202, 278.1, 296; 329/319, 325; 226.1/226.2

[56] References Cited

U.S. PATENT DOCUMENTS

| | | | |
|---|---|---|---|
| 3,922,606 | 11/1975 | Nordling | 375/30 |
| 3,953,805 | 4/1976 | Couvillon | 328/162 |
| 4,238,850 | 12/1980 | Vance | 370/27 |
| 4,258,327 | 3/1981 | Fujimoto | 329/101 |
| 4,345,211 | 8/1982 | Longworth | 329/325 |
| 4,454,604 | 6/1984 | Myers | 329/325 |
| 4,476,585 | 10/1984 | Reed | 455/207 |
| 4,527,278 | 7/1985 | Deconche et al. | 329/325 |
| 4,605,904 | 8/1986 | Hass-Chelade | 329/325 |
| 4,713,563 | 12/1987 | Marshall et al. | 307/490 |
| 4,718,113 | 1/1988 | Rother et al. | 455/209 |
| 4,726,069 | 2/1988 | Stevenson | 455/202 |
| 4,731,796 | 3/1988 | Masterton et al. | 455/142 |
| 4,736,390 | 4/1988 | Ward et al. | 375/75 |
| 4,766,392 | 8/1988 | Moore | 329/124 |
| 4,811,425 | 3/1989 | Feerst | 455/317 |
| 4,873,702 | 10/1989 | Chiu | 375/76 |
| 4,893,316 | 1/1990 | Janc et al. | 455/296 |
| 4,926,443 | 5/1990 | Reich | 455/304 |
| 4,944,025 | 7/1990 | Gehring et al. | 455/207 |
| 4,995,104 | 2/1991 | Gitlin | 455/295 |
| 5,052,050 | 9/1991 | Collier et al. | 455/296 |
| 5,140,699 | 8/1992 | Kozak | 455/278.1 |

FOREIGN PATENT DOCUMENTS

| | | |
|---|---|---|
| 516022 | 3/1979 | Australia . |
| 0034383 | 8/1981 | European Pat. Off. . |
| 0324581 | 7/1989 | European Pat. Off. . |
| 0474615A2 | 3/1992 | European Pat. Off. . |
| 3346725 | 7/1985 | Fed. Rep. of Germany . |

OTHER PUBLICATIONS

Soviet Inventions Illustrated, Section E1—Sep. 14, 1983, p. 6, AN 83-727325; SU-960-857-A, (Lapushkina).

European Search Report of application number EP 91 85 0216, Sep. 8, 1992.

James J. Spiker, Jr., "Delta Modulation and Differential PCM", *Digital; Communications by Satellite*, pp. 74, 75, 111, (1977).

V. D. Mytri et al., "Constant Factor Incremental Delta Modulator", *International Journal of Electronics*, vol. 61, No. 1 (1986), pp. 129-133.

*Primary Examiner*—Reinhard J. Eisenzopf
*Assistant Examiner*—Timothy H. Keough
*Attorney, Agent, or Firm*—Burns, Doane, Swecker & Mathis

[57] ABSTRACT

A zero-IF radio receiver eliminates DC offset without distortion or loss of the low-frequency and DC components of the received or desired signal by initially differentiating the received signal to filter out the DC offset. The signal is amplified to a suitable level and then integrated to recapture the original DC and low frequency signal components. The integration essentially restores the filtered components to the original value in the amplified signal using an arbitrary constant of integration of bounded magnitude to generate a restored signal. Using various techniques that exploit predetermined signal patterns or inherent signal properties of the desired signal, the DC offset can be reasonably estimated. The DC offset estimate is then subtracted out of the restored signal leaving the amplified, received signal substantially free from distortion. An advantageous method for differentiating and digitizing the received, signal uses the technique of companded delta modulation.

32 Claims, 9 Drawing Sheets

D.C. OFFSET COMPENSATION IN A RADIO RECEIVER

FIELD OF THE INVENTION

The present invention relates to radio receivers and specifically to radio receivers of a zero intermediate frequency (zero-IF) design.

BACKGROUND OF THE INVENTION

In the field of radio receivers, there has been a concentrated effort to reduce the amount of tuned circuitry used in the receivers. By reducing the number of tuned circuits, large portions of the receiver can be integrated resulting in smaller receivers. These compact receivers can then be used in many areas such as cellular telephones. A major advance in the design of such receivers is a technique known as the "zero-IF" technique.

According to theory, an IQ radio receiver can be constructed according to FIG. 1, in which the radio signal S from the antenna 1 is applied directly to two balanced, quadrature mixers 2a, 2b (mathematically-multiplying devices) where the signal is multiplied respectively by a sine and cosine wave at the carrier frequency of signal S generated by a local oscillator 3. In this manner, the I-channel or in-phase signal and the Q-channel or quadrature signal are generated. The multiplication devices yield outputs containing both sum frequency components around $2f$ and difference frequency components around zero frequency. DC or low pass filters 4a, 4b eliminate the former and accept the latter. The zero frequency components can then be amplified to any convenient level by low-frequency amplifying stages 5a, 5b instead of high frequency amplifiers. Essentially, the zero-IF receiver eliminates the interim conversion to an intermediate frequency by converting the incoming signal directly to baseband in a single operation.

In practice, this so-called zero-IF approach is beset with a variety of practical problems, one of which concerns the imperfection of the balanced mixers as compared to perfect mathematical multipliers. The most troublesome aspect of this imperfection is the generation of a DC offset or standing voltage that can be many orders of magnitude greater than the desired signal. The low frequency amplifiers, which receive the mixer outputs, can be forced into saturation by the large DC offset long before the desired signal has been amplified sufficiently.

To avoid premature saturation, RF amplifiers can be added ahead of the mixers to raise the desired signal voltage level. Unfortunately, a common source of the offset is leakage from the local sinusoidal oscillator back to the antenna, producing coherent interference. As a result, RF amplification is not a satisfactory solution because the desired signal and coherent interference are amplified equally.

Another proposed solution used in conventional superheterodyne radio receivers is partial amplification of the input signal at the original antenna frequency. The partially amplified signal is then converted to a convenient intermediate frequency (IF) for further amplification before being applied to the balanced quadrature mixers. In this situation, the locally generated sine and cosine waves are at the IF rather than the antenna frequency, so leakage back to the antenna is of no consequence. However, by adding IF tuning circuitry, the simplicity and reduced size of the zero-IF receiver are lost.

An alternative method of overcoming DC offset from the IQ mixers may employ the technique variously called AC coupling, DC blocking, high-pass filtering or differentiation to eliminate the standing or DC offset voltage. The trade-off with this method is the result that the DC and low-frequency components are lost or gravely distorted. This trade-off is unacceptable in digital transmission systems which use QPSK (Quadrature Phase Shift Keying) or MSK (Minimum Shift Keying) modulation techniques. These modulation techniques generate low frequency components that must be preserved.

Accordingly, it is desirable to provide a method of compensating for low frequency offset without losing or distorting the DC and low-frequency components of the desired signal.

SUMMARY OF THE INVENTION

The present invention relates to zero-IF radio receivers designed to eliminate DC offset without distortion or loss of the low-frequency and DC components of the received or desired signal. Initially, the received signal is differentiated to filter out the DC offset. The signal is amplified to a suitable level and then integrated to recapture the original DC and low frequency signal components. The integration essentially restores the filtered components to their original values in the amplified signal using an arbitrary constant of integration of bounded magnitude to generate a restored signal. Using various techniques that exploit predetermined signal patterns or inherent signal properties of the desired signal, the DC offset can be reasonably estimated. The DC offset estimate is then subtracted out of the restored signal leaving the amplified, received signal substantially free from distortion. An advantageous method for differentiating and digitizing the received signal utilizes a companded, delta modulation technique.

DETAILED DESCRIPTION OF THE PREFERRED EMBODIMENTS

The present invention concerns the removal of an unwanted DC offset voltage from a signal processing channel while preserving the DC and low-frequency components of the signal to be processed. The invention is equally applicable to a single channel, to dual channels of the type encountered in quadrature or (IQ) types of radio receivers and to systems having more than two parallel processing channels.

Figure 1:
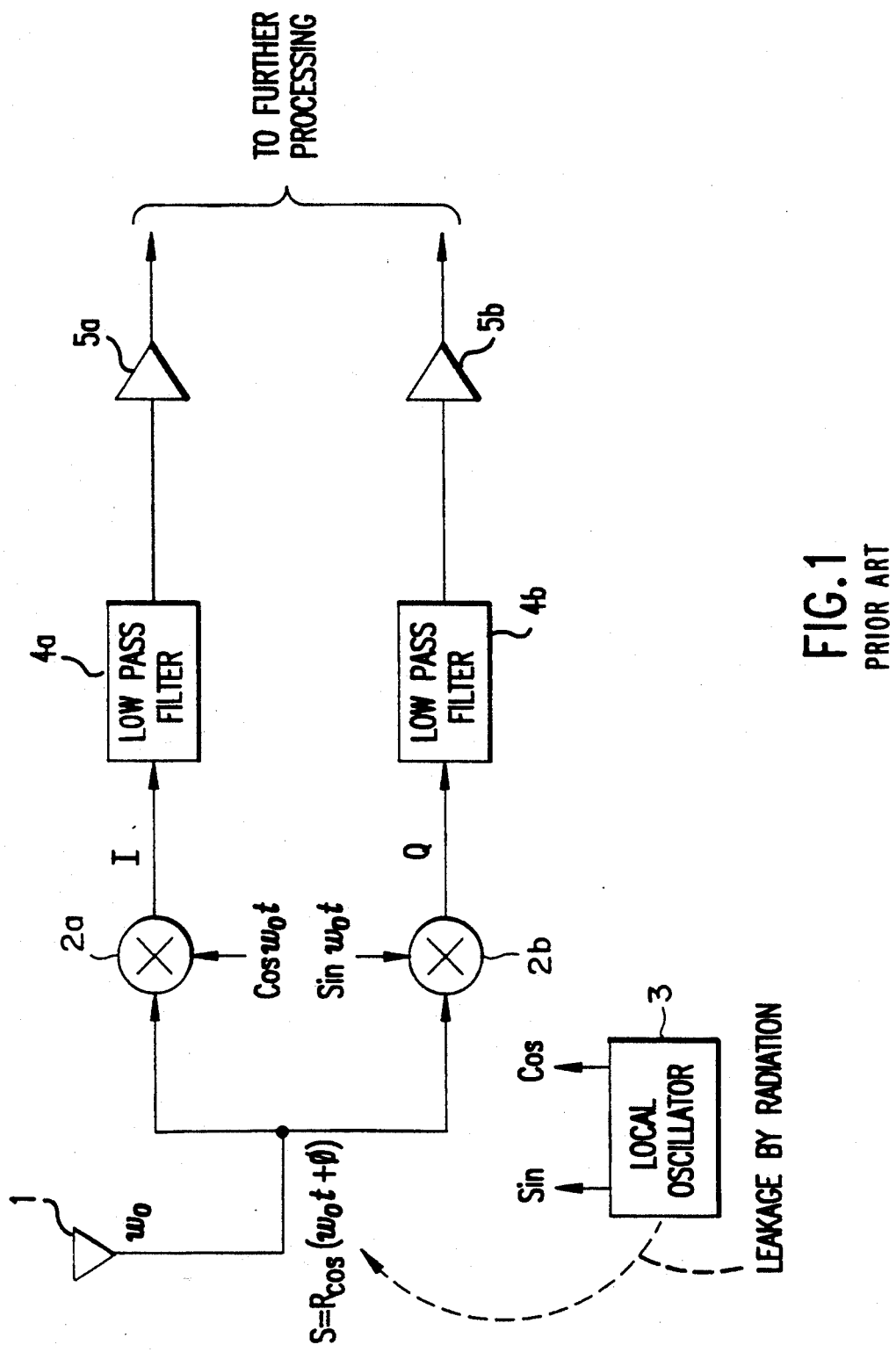
FIG. 1 is a simple block diagram showing a receiver using the zero-IF technique.
Figure 2A:
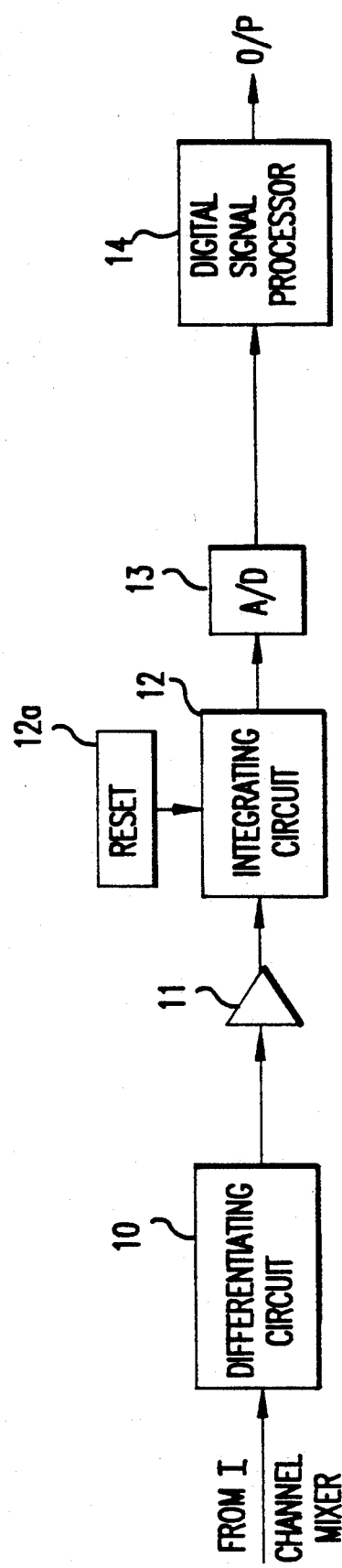
FIGS. 2(a) and 2(b) are block diagrams of zero-IF receivers of different embodiments of the invention.

The basic principle behind the invention is shown in the functional block diagram of FIG. 2(a). For purposes of discussion only, FIG. 2(a) shows only one channel of a radio receiver, for example, the "I" channel of a dual channel IQ receiver. It is understood that the parallel "Q" channel, as well as additional parallel channels, have similar hardware components. The signal received from the in-phase mixer is applied to a differentiating circuit 10 which removes the DC offset voltage. The differentiation circuit 10 also attenuates low frequency components of the desired signal, with respect to high frequency components, which distorts the nature of the signal. With the DC offset voltage removed, the desired signal is amplified in a low frequency amplifier 11 to usable levels without the premature amplifier saturation that occurs when such offsets are present. To restore the original nature of the signals, the output of the differentiating circuit is applied to an integrating circuit 12 which performs the inverse operation of differentiation. The output of the integrating circuit 12 is referred to as the restored signal because it includes the amplified portion of the originally received signal as well as the low frequency and DC portions of the received signal (represented by the constant of integration).

Once amplified and restored, the in-phase (I) and quadrature (Q) signals can be converted in an A-to-D converter 13 to digital form for further processing in a digital signal processor 14. Further processing can include phase demodulation, amplitude demodulation, or frequency demodulation. In principle, these demodulation processes can be implemented using software techniques as can other more complex demodulation processes for hybrid AM/PM phase modulation signals such as 256 QAM (quadrature AM).

Without a method to determine the starting value, an arbitrary constant of integration is used. In the case of signals having a definite start time, a known signal feature, or a pattern embedded in the signal, the contents of the integration circuit are initially set to equal the known value. The integration circuit 12 can also be readily reset to zero by activating a reset control 12a. After reset, the very first value output from the integration circuit 12 will be zero. In the situation where the actual value of the desired signal is zero initially, the output of the integration circuit 12 will be accurate from the start. At subsequent time periods, the differentiating and integrating operations cancel each other out.

In situations where the initial desired signal value is a non-zero value, VO, the output from the integration circuit 12 will always be in error by a constant, ($-$VO). However, this error ($-$VO) is of the same order of magnitude as the desired signal. In contrast, the originally input DC offset voltage may have been several orders of magnitude greater than the desired signal. Consequently, the differentiation/integration of the desired signal eliminates premature amplifier saturation by preserving the DC component of the signal at manageable voltage levels.

Figure 2B:
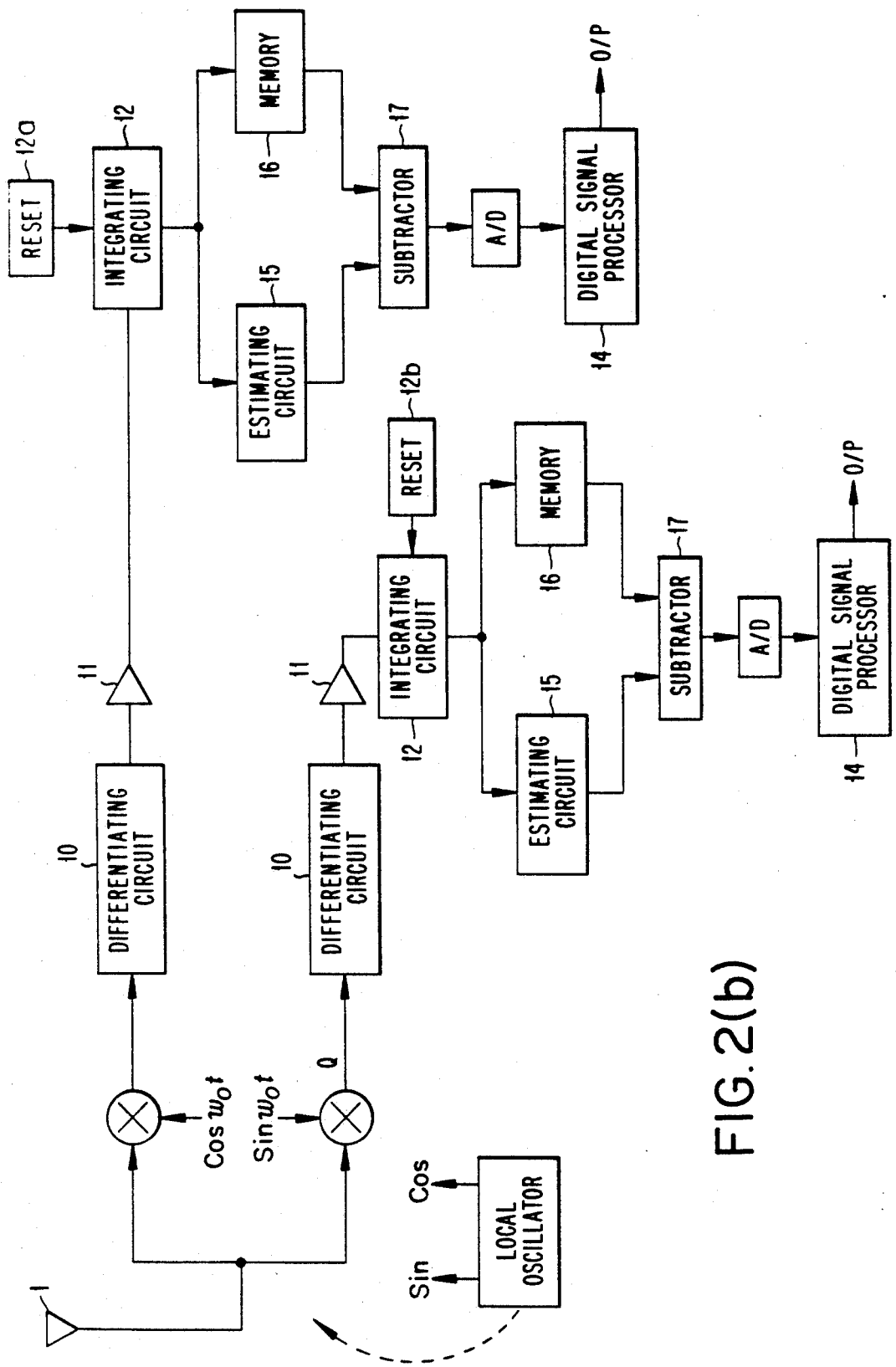

Another preferred embodiment of the invention, shown in FIG. 2(b), concerns the removal of the offset ($-$VO) by estimating the offset and subtracting it from the restored signal. For example, an estimating circuit 15 computes the offset error ($-$VO) during a period in which the desired signal is executing a known, deliberately inserted pattern or waveform. Similarly, the estimating circuit 15 may determine the offset using some natural or inherent property of the desired signal. Specific examples of how this estimation process takes place are set forth below. After estimation of the offset error, it is subtracted from the restored signal held in memory 16 in a subtracting circuit 17 to yield an error-free output signal. If the known portion of the desired signal does not occur at the beginning of the signal sequence, the known portion may be delayed or stored in the memory device 16 until the offset estimate is available.

Examples of both deliberately inserted patterns and inherent signal properties that facilitate the estimation of the offset are described below.

(1) Deliberate signal pattern: In a single-channel system, signal sequences might be arranged to include a known pattern $+V$, $-V$, $+V$, $-V$ . . . which ultimately has a mean of zero. The estimating circuit 15 computes the mean of the restored signal over an even number of samples. Since the known mean is zero, the estimate of the offset ($-$VO) simply equals the computed mean.

Indeed, any known pattern of changing signal voltages (v1, v2, v3, v4 . . . ) can be used by employing the well known least-squares curve fitting technique. If the scaling of the signal is unknown, represented by the constant (a1) to be determined, the offset to be determined is represented by a0. During the period of a known signal pattern, the expected curve can be expressed mathematically as: $a0+a1.v1$; $a0+a1.v2$; $a0+a1.V3$ . . . Instead, the signals actually observed are (u1, u2, u3 . . . ). By solving the equations:

$$a0+a1.v1=u1$$

$$a0+a1.v2=u2$$

$$a0+a1.v2=u3$$

for the unknowns a0 and a1, with (v1, v2, v3 . . . ) and (u1, u2, u3 . . . ) being known, acceptable estimates of (a0) and (a1) may be obtained. Such a solution may be implemented using the digital signal processor 14 if the signal to be processed has first been digitized by means of the A-to-D converter 13. Because the coefficients of the equations, (v1, v2, v3 . . . ) are known and fixed a priori, a coefficient matrix can be generated, inverted, stored, and used to solve for unknowns (a0), and (a1). The inverse of a non-square coefficient matrix T of the type encountered in least-squares solutions is given by:

$$T^{-1}=(TT^{-1}) \cdot T$$

Where (') signifies conjugate transpose.

Similar to the single-channel system, in two-channel systems, such as the zero-IF or IQ receivers, the deliberate pattern used to estimate the offsets in the two channels can take the form of a sequence of predetermined complex numbers. The unknown scaling factor, (a1), a real number in the single channel example, becomes a complex one, (c1). A complex scaling factor c1 accounts for both an arbitrary amplitude scaling and arbitrary phase shift in transmission. Likewise, the two offsets to be determined, (a0) in the I channel and (b0) in the Q channel, can be regarded as a single complex vector offset, $c0=(a0+jb0)$, where (a0) is a real vector component and (b0) is an imaginary vector component. The same equations as described above for least-square estimation can be utilized with the exception that all quantities are complex vectors. Such equations can also be solved conveniently in the digital signal processor 14 because the coefficient matrix again consists of predetermined constants. Once the matrix is inverted and stored, it can be used for subsequent offset estimations.

(2) Inherent signal properties: A common form of radio signal processed by zero-IF or IQ receivers is a constant-envelope, modulated signal which varies only in phase, not amplitude. The signal locus in the complex plane describes a circle in which $$I^2 + Q^2 = R^2;$$

where R = the radius of a circle and is a constant. The unknown offsets in the I and Q channels displace the center of this circle away from the origin (0, 0). Estimating the offset from a set of observed points (I1, Q1), (I2, Q2) ... is accomplished by first determining the equation of a circle that best fits the observed points. The vector distance of the center of the best fit circle from the origin provides the necessary offset. This problem can also be solved numerically in digital signal processor 14 (DSP) using least-squares fitting techniques.

Many other forms of signals have inherent properties than can be processed to determine the offset value. While some may have advantages in aspects such as insensitivity to noise, the precise property used depends on a number of design factors specific to the particular application.

FIGS. 3(a)-3(d) show several different embodiments for implementing the differentiation and integration functions of the block diagram circuit shown in FIG. 2(a).

Figure 3A:
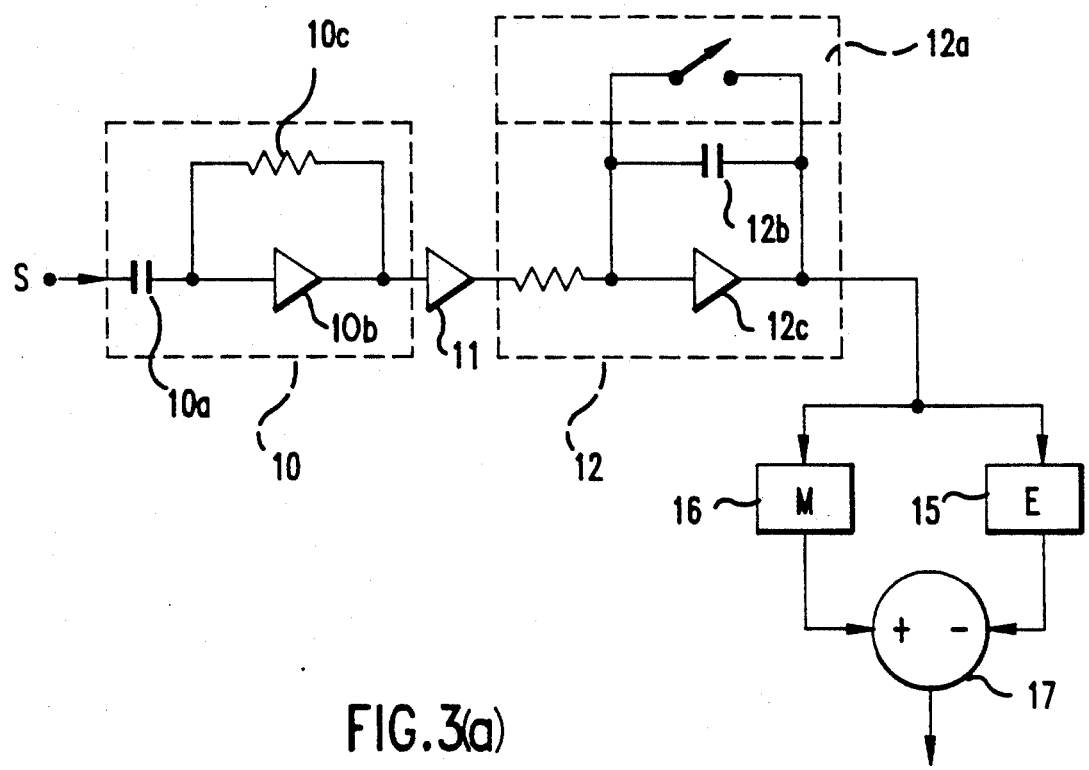
FIGS. 3(a)–3(e) show different embodiments of the differentiation-integration portion of the zero-IF receiver according to the invention.

FIG. 3(a) illustrates an analog implementation of the differentiating and integration functions using operational amplifiers. An analog differentiator 10 includes a capacitor 10a in series with an operational amplifier 10b, having a resistive feedback loop 10c. After amplification, the signal is fed to a simple integrator 12 composed of a feedback capacitor 12b in parallel with an operational amplifier 12c. A reset switch 12a is used to initialize the capacitor 12b voltage to zero at the beginning of a signal sequence.

Figure 3B:
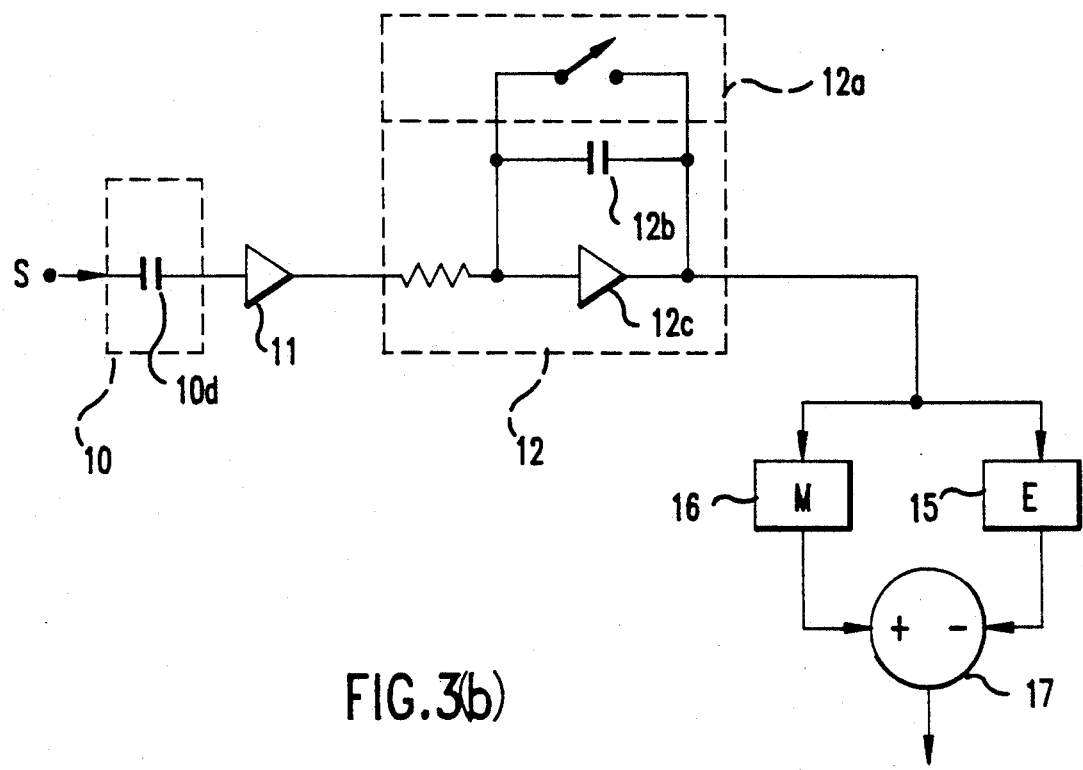

FIG. 3(b) shows an implementation of the differentiating and integrating circuit using only a single operational amplifier. A capacitor 10d essentially differentiates the incoming signal by blocking DC voltage. The capacitor 10d output is then fed to an analog integrator 12 of the type shown in FIG. 3(a).

Figure 3C:
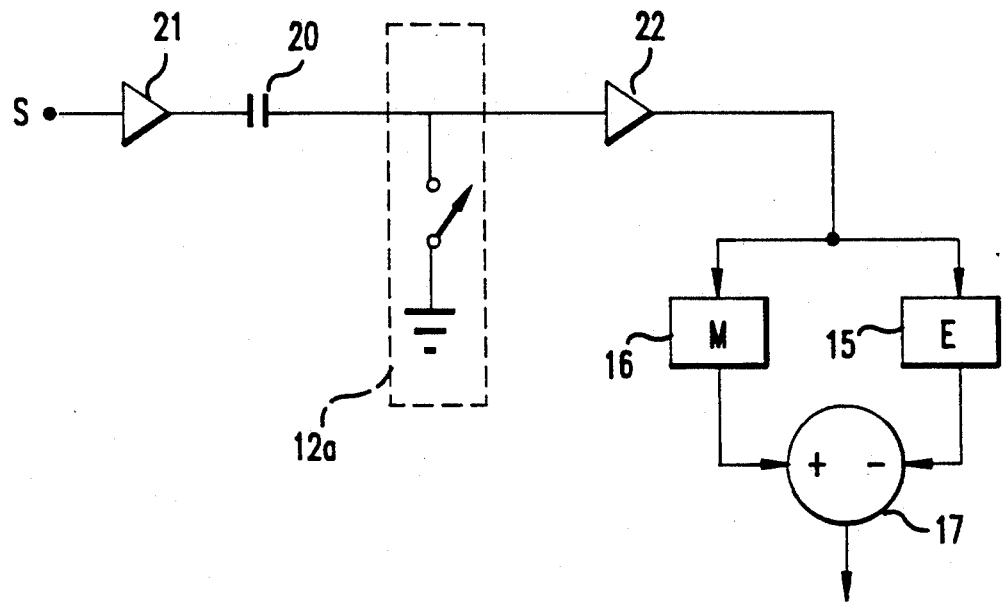

FIG. 3(c) illustrates the use of a "chopper" technique to accomplish the same ends. In the chopper technique, a single capacitor 20 performs both differentiation and integration. A blocking capacitor 20 connected in series with infinite impedance amplifiers 21,22 generates only a change in the DC level of the input signal. That change equals the initial charge on the capacitor 20. The capacitor therefore functions as the mathematical equivalent of differentiation followed by integration which introduces an arbitrary constant shift in the DC portion of the input signal.

Figure 3D:
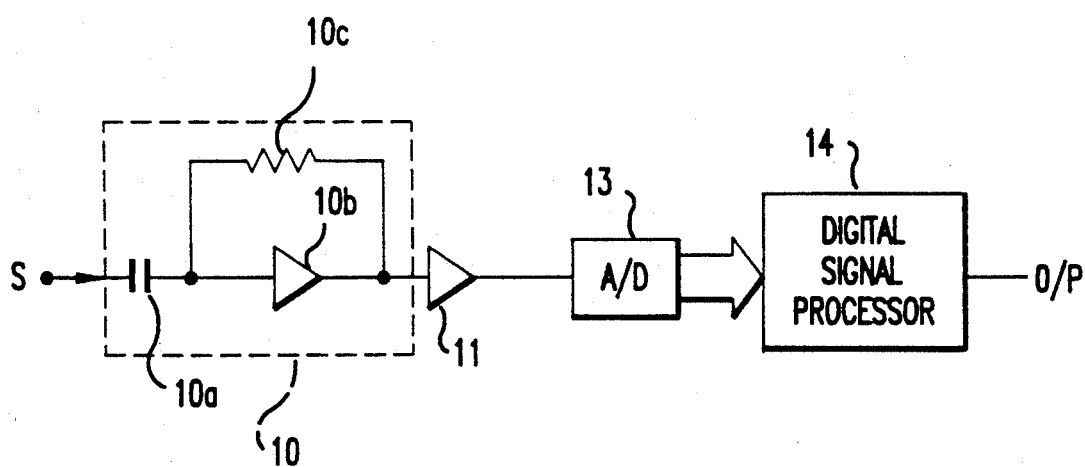

A preferred method of differentiating and integrating for many applications is shown in FIG. 3(d). The differentiation is carried out by an analog differentiator 10 similar to that shown in FIG. 3(a). The signal is then converted to digital form via an A-to-D converter 13. The integration function of the integrating circuit 12 is performed numerically by the digital signal processor 14 using well known accumulation techniques. After a certain time period, the accumulated result is proportional to the sum of all elementary contributions applied to the input during the integration time, plus the original starting value of the integrator/accumulator. For example, if u(t) = the integral of v(t) dt, where v(t) is the differentiated input signal, then for digitally converted inputs (v1, v2, v3 ... vn), the integrated signal u(t) can be approximated using the following:

$$u_i = u_{i-1} + v_i.$$

Figure 3E:
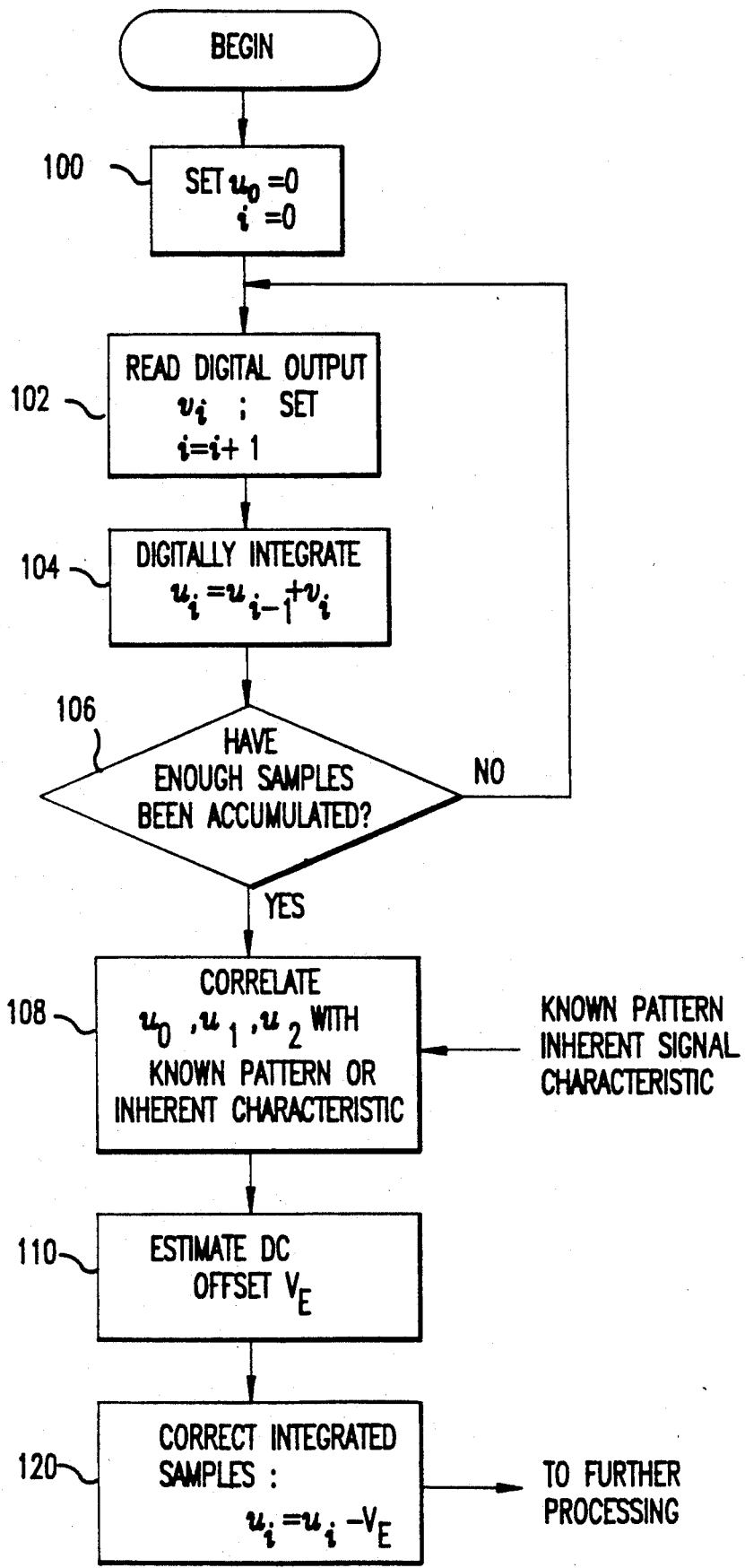

A flow chart of the program control followed by the digital signal processor 14 to implement the integration function is illustrated in FIG. 3(e). In block 100, the integration value u is preset to an initial value in this case $u_0$ is preset to 0. The sample count variable i is also preset to 0. Control proceeds to block 102 where the digital output $v_i$ is read from the analog-to-digital converter 13. The sample variable count is incremented by 1. The digital integration is performed in block 104 by adding the current digital sample $v_i$ to the previous integration value $u_{i-1}$ to generate the current integration value $u_i$. A decision is made in block 106 to determine if enough samples have been accumulated. If not, the flow control returns to block 102. If enough samples have been accumulated, control proceeds to block 108 where several of the digital integration values $u_0$, $u_1$, $u_2$ are correlated with a known pattern or inherent signal characteristic. Based on this correlation, the estimate of the DC offset $V_E$ is determined in block 110. Finally, in block 120, the integrated sample values $u_i$ are corrected to remove the estimated DC offset $V_E$.

The advantage of digital integration is that the integration may be preset with an exact, predetermined start value and does not suffer from noise or switching transients associated with the analog reset circuits. Moreover, the resetting can be accomplished partially to any desired value other than zero. Another advantage of a digital implementation is the offset estimates can be continuously updated during a continuous signal sequence rather than requiring a specific starting point to be identified.

In another preferred embodiment of the invention, the differentiation procedure followed by an analog-to-digital conversion may be implemented using a delta modulation technique. Delta modulation is a type of predictive quantitizing system equivalent to a one-digit differential pulse code modulation system. Such systems are based on transmission of the quantified difference between successive sample values rather than of the samples themselves. Consequently, a delta modulator estimates or predicts the input signal value based on the previously transmitted sequence of signals. A benefit of this technique is that only changes in the input voltage are digitized.

Figure 4A:
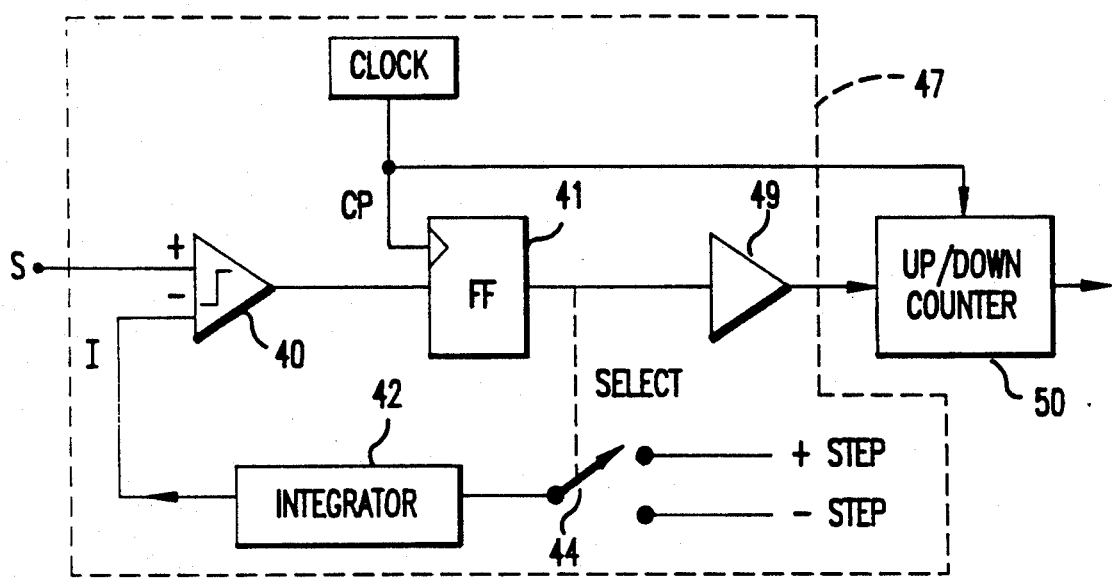
FIGS. 4(a)–4(d) are block diagrams illustrating the delta modulation embodiments according to the invention.

The principles of operation of delta modulation are described in conjunction with FIG. 4(a). An input signal S is fed to a comparator 40. The other input to the comparator 40 is the feedback output of an integrator 42. The output of the comparator 40, either a digital "1" or "0", is latched in a D-type flip-flop 41 at the falling edge of every clock pulse CP. The digital bit sequence output from the flip-flop 41 is fed back through a switch 44 having a positive or a negative current step connection to the integrator 42.

In operation, the comparator 40 detects a change in the input signal S relative to the integrator 42 feedback signal I and outputs a digital "1" when the amplitude of S exceeds I and a digital "0" when S is less than I. Because the comparator 40 detects the change in signals, it effectively functions as a differentiator detecting only changes in the value of the signal. The flip-flop 41 converts the output of the comparator 40 into a digital bit stream through a regular clock pulse CP. Thus, the comparator 40 and flip-flop 41 perform the function of an analog-to-digital converter. The flip-flop 41 controls whether the current step inputs to the integrator 42 ramp the integrator output value up or down. A digital "1" causes the switch 44 to select a positive current step. Conversely, a digital "0" causes the switch to select a negative current step.

The bit stream output from the flip-flop 41 essentially represents the time derivative of the input signal S in digital form. Therefore, if the rate at which the decision to change the polarity sign of the current step is sufficiently high, the output value from the integrator 42 will be forced to follow the input signal quite closely.

The output sequence from the flip-flop 41 may require further amplification in an amplifier 49. However, a large part of the total system gain may be achieved in the comparator 40 so that amplification of the signal elsewhere may be reduced. A good system design attempts to minimize the amplification needed prior to comparison by using a sensitive comparator because the prior gain stages have no protection against saturation from strong signal levels.

After suitable amplification in an amplifier 49, each bit in the bit stream output can be characterized as an UP/DOWN command which can be monitored by an up/down counter 50, with a 1 corresponding to up and a 0 corresponding to down. Because the counter accumulates the positive and negative changes of the input signal S with respect to the previous signal value, it performs the function of the integrating circuit 12 digitally, i.e., it reintegrates the signal. The count value is equivalent to the integrated value plus some offset equivalent to the arbitrary constant of integration referred to in previous embodiments.

There are two types of delta modulation, linear and adaptive. In linear modulation, the value of the input signal at each sample time is predicted to be a particular linear function of the past values of the signal. In adaptive delta modulation, the value of the input signal at each sample time is predicted to be a nonlinear function of the past values of the signal. Introducing nonlinear prediction into delta modulation provides a useful means of extending the range over which the system yields its optimum performance.

Figure 4B:
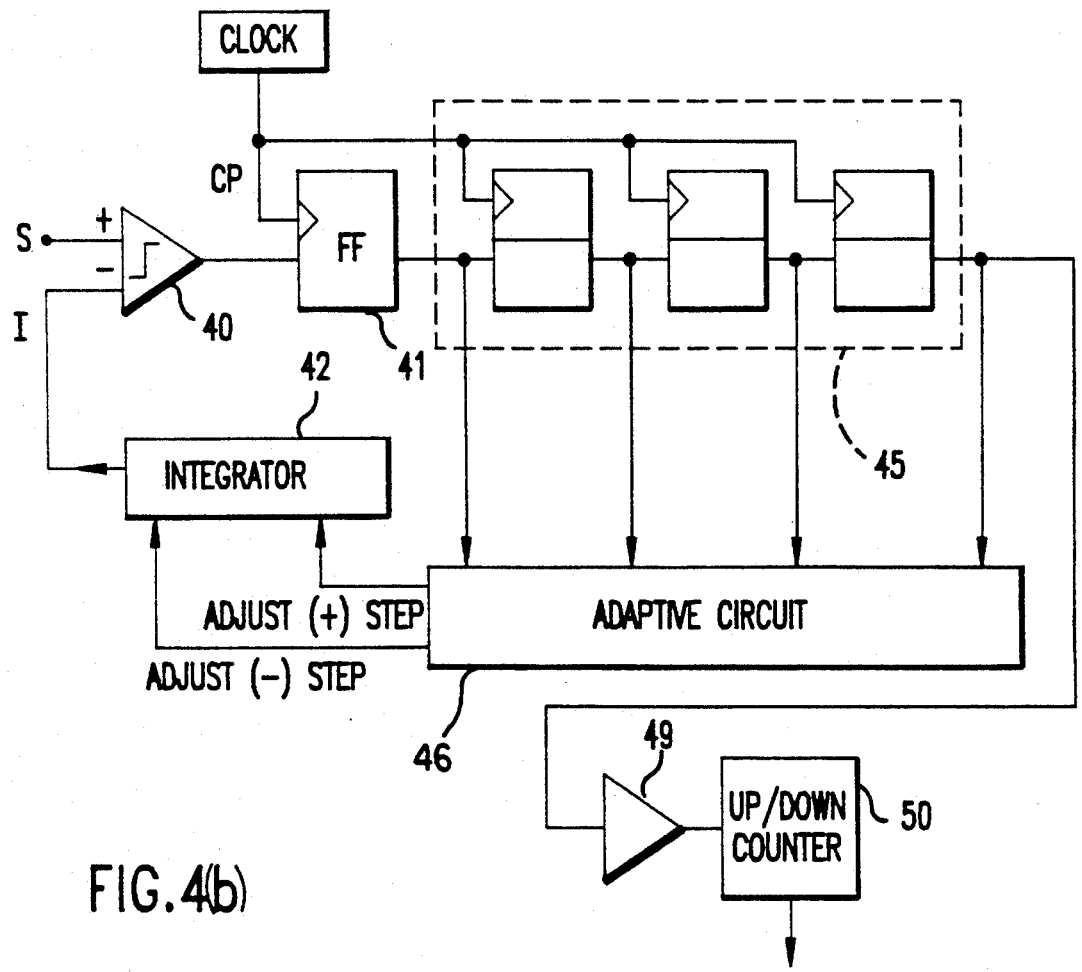

FIG. 4(b) demonstrates the principle of an adaptive delta modulator. One of the benefits of this adaptive technique is that by integrating common companding techniques with delta modulation, the current step value input to the integrator 42 can adapt itself to the signal level being digitized. If the signal consists of a small varying part to be observed plus a large non-varying part, e.g., the D.C. offset component, the system will initially produce an up-up-up or a down-down-down sequence of adjustment steps to the integrator 42 until the mean voltage equals the large, non-varying part of the input voltage. At that point, if there is no varying portion of the input signal, the sequence output would become 1 0 1 0 1 0 causing the size of the up-down steps to collapse and leaving the integrator mean voltage centered on the large non-varying portion of the input voltage. When the step size has collapsed to the level of the small varying part of the signal, the output bit sequence will depend only on the varying part of the signal. Thus, the large, undesired D.C. component is inherently differentiated using this process.

In the integration process after delta modulation, the effect of differentiating the varying component of the input signals is cancelled restoring the original nature of the signal. However, the D.C. offset that is restored depends on the initial value that is stored in the digital integrator or accumulator. If the accumulator is initialized to 0 and the true signal value before corruption by the addition of the D.C. offset was indeed 0, then the true signal will be perfectly reproduced without the D.C. offset. However, if the accumulator is initialized to 0 and the true signal level is not 0 but some value, say 10 micro-volts, then this 10 microvolt error will appear as a −10 microvolt offset or shift of the whole signal wave form after integration. It should be noted again that the value of this error has been limited to the same order of magnitude as the desired signal, and therefore, can be handled in the digital signal processor 14 without saturation or clipping by estimating the value of the offset during a period of known, transmitted signal patterns. For example, if the true signal that is transmitted was 0 for several periods in the middle of a message transmission, but after integration a value in the middle of the wave form sequence of −13.5 microvolts was obtained, then it would be apparent that the differentiating-integration operation introduced an error of −13.5 microvolts. Accordingly, a value equivalent to 13.5 microvolts would be added to all of the digitized samples of the wave form before further processing.

Referring to the circuit of FIG. 4(b), a shift register 45 stores the three most recent outputs from the flip-flop 41. If desired, more or less outputs could be stored in a shift register having the desired number of bits. An adaptive circuit 46 receives three bit signals stored in the shift register 45 and one bit signal from the flip-flop 41. Based on the results of the comparison in comparator 40, the adaptive circuit 46 outputs a positive or negative current step value to the digital integrator 42.

From these four bit value signals, the adaptive circuit 46 determines whether to vary the value of the current step input to the integrator 42. For example, if the four bit values are 1 1 1 1, this indicates that the integrator 42 is not keeping pace with the increasing value of the incoming signal. Thus, when such a pattern is detected, the value of the positive current step is increased. On the other hand, if the four bit values are 0 0 0 0, the value of the negative current step is increased. In the situation where the register stores 1 0 1 0, a decision may be made by the adaptive circuit 46 that the step values are too large or coarse. The magnitude of the step value for both the positive and negative steps can then be decreased.

The adaptive circuit 46 may be a conventional microprocessor. The software for implementing the adaptive functions may be, for example, a well-known adaption algorithm used in continuously variable slope delta modulation systems (CVSD) for speech coding. This algorithm consists of increasing the step size by a given amount whenever N-like bits appear sequentially at the output of the shift register 45. N is typically 3 or 4 for speech coding purposes. For example, if N equals 4, the step sizes increase whenever the sequence 1 1 1 1 or 0 0 0 0 appears, indicating the system is not responding fast enough to drive the integrator 42 to follow the signal. Accordingly, the microprocessor or adaptive circuit 46 would increase the step size, rate, or slope by a predetermined value. Conversely, when the sequences 0 0 0 0 or 1 1 1 1 are not output from the shift register 45, the step size is allowed to decrease by exponential decay.

An alternative algorithm may also be implemented by the adaptive circuit 46 as published by V. D. Mytri and A. D. Shivaprasad, International Journal of Electronics, 1986, Volume 61, No. 1, pp. 129-133. This algorithm changes the step size depending on the N last bits in a more general way. For example, if N equals 4, 16 different step size amounts for changing the step size may be selected according to the recent history of the four output bits. These 16 step size amounts are precomputed to optimize the system performance in terms of quantifying noise and reaction time to sudden increases in the signal level and may be stored, for example, in a look up table that is addressed by the four most recent bits.

Variance of the current step value is a form of automatic gain control (AGC) that adapts the quantitizing steps to match the received signal level. As a result, the integrator 42 must be incremented or decremented by a digital number corresponding to the step value rather than +1 or −1. However, the step value is simply a function of the most recent output bit sequence and is readily determined by the adaptive circuit 46.

Figure 4C:
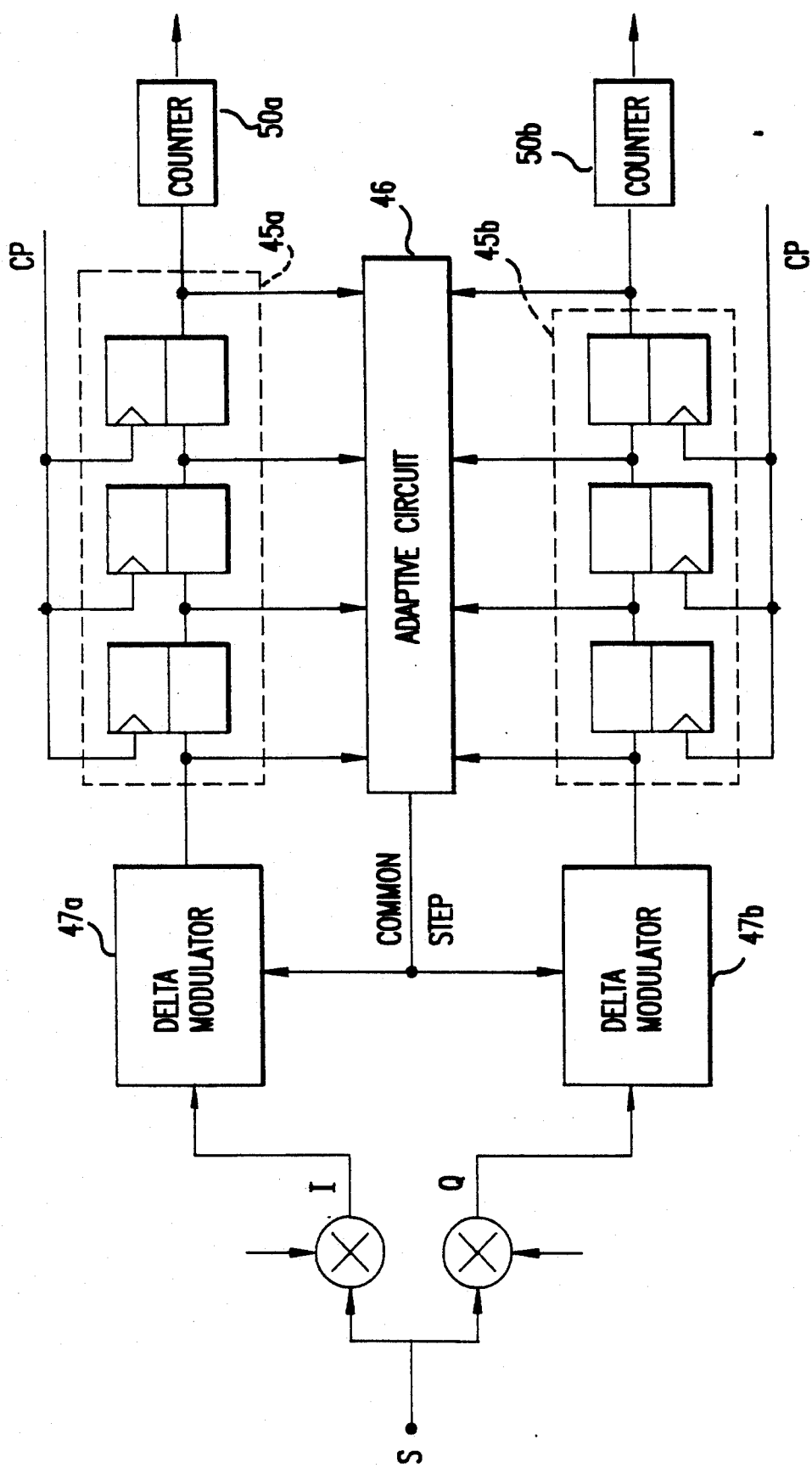

In multi-channel systems, such as the two channel system of a zero-IF receiver, it is advantageous to use the same value of the current step value for each channel. FIG. 4(c) illustrates the use of the adaptive delta modulation technique in a zero-IF receiver. Each channel signal is input to its respective delta modulator 47a, 47b similar to that shown in FIG. 4(a). As discussed with regard to FIG. 4(b), the output bit sequence from each modulator is input to a corresponding shift register 45a, 45b which stores the most recent bits in the output sequence. The shift register outputs are input to a joint step-size adaptive circuit 46. The adaptive circuit 48 determines the value of the current step to be input to the integrating circuit 42 of each channel based on the past bit sequence history of both channels. Jointly adapting the step value for each channel preserves the relative scaling of the I and Q channels which simplifies later computations of phase or frequency.

Figure 4D:
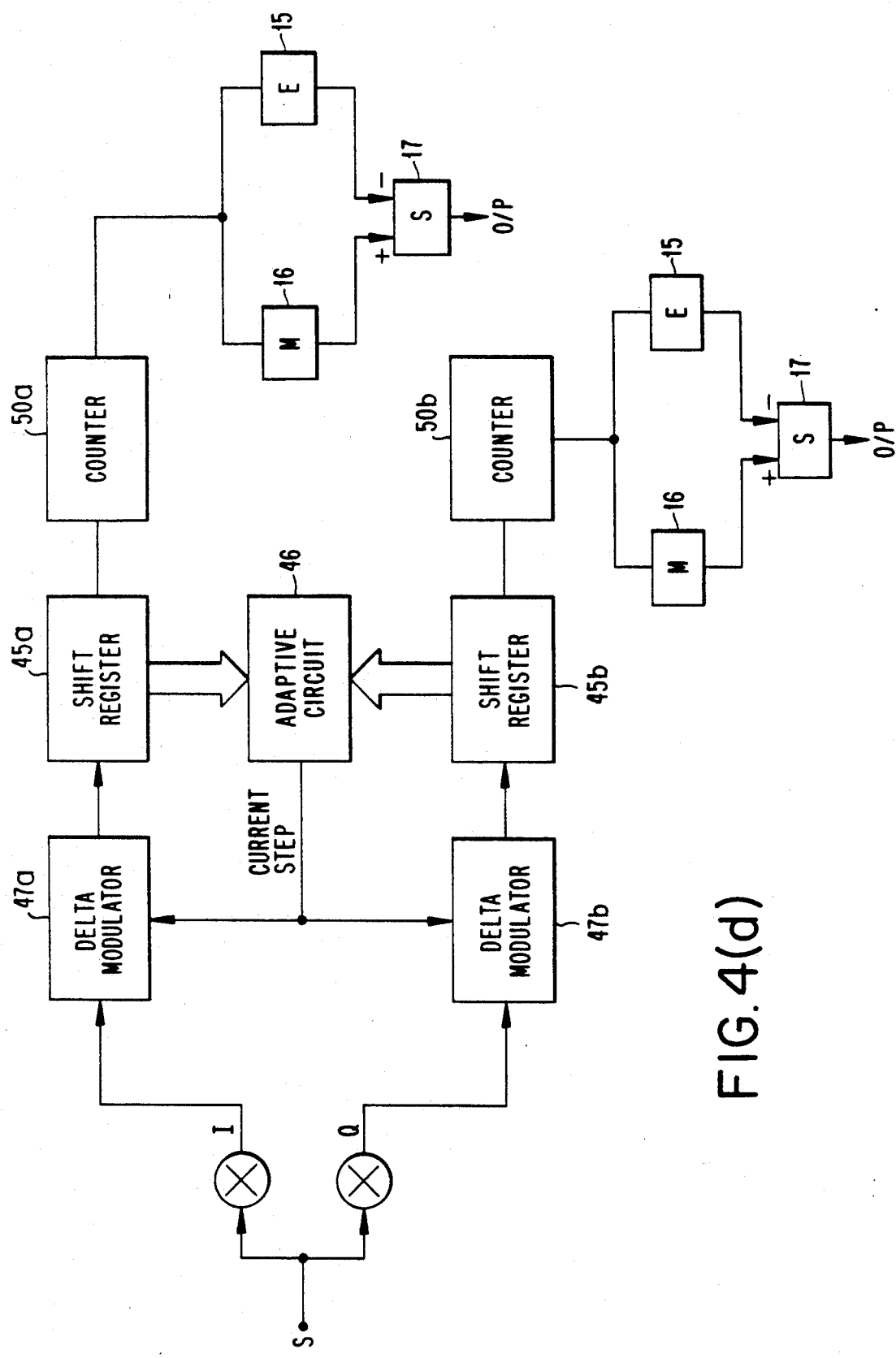

FIG. 4(d) shows the components of FIG. 4(c) and estimating means 15, memory 16, and subtracting means 17 for estimating the DC offset and removing it as described above in connection with FIGS. 2(b) and 3(a)-3(c).

Although the present invention has been described with respect to single and two-channel systems, the principles of the invention apply equally as well to systems having more than two or N channels of operation.

The invention has been described in terms of specific embodiments to facilitate understanding. The above embodiments, however, are illustrative rather than limitative. It will be readily apparent to one of ordinary skill in the art that departures may be made from the specific embodiments shown above without departing from the essential spirit and scope of the invention. Therefore, the invention should not be regarded as being limited to the above examples, but should be regarded instead as being fully commensurate in scope with the following claims.

I claim:

1. In a radio receiver, an apparatus for compensating for DC offset in a signal comprising:
   means for generating a channel signal from a received radio signal;
   blocking means for blocking a DC component of the channel signal;
   amplifying means, connected to said blocking means, for amplifying a signal output from said blocking means and producing an amplified signal;
   restoring means, connected to said amplifying means, for restoring said DC component to said amplified signal, said restoring means having an output for a restored signal including said amplified signal and said DC component;
   means, connected to the output of said restoring means, for estimating an error in the DC component;
   memory means, connected to said restoring means, for storing the restored signal; and
   subtracting means, connected to said estimating means and said memory means, for subtracting the error from the restored signal to produce a compensated restored signal, said subtracting means having an output for the compensated restored signal.

2. The apparatus as defined in claim 1, wherein said estimating means includes a digital signal processor for determining the error based on a predetermined signal pattern in the received radio signal.

3. The apparatus as defined in claim 1, wherein said estimating means includes a digital signal processor for determining the error based on an inherent waveform characteristic of the received radio signal.

4. The apparatus as defined in claim 1, wherein the blocking means includes a delta modulator for blocking DC signal components and digitizing the channel signal.

5. In a radio receiver, an apparatus for compensating for DC offset in a signal comprising:
   means for generating a channel signal from a received radio signal;
   means for differentiating the channel to eliminate a DC component in the channel signal;
   means for amplifying a signal output from said differentiating means and producing an amplified signal;
   means for integrating the amplified signal to thereby recover said DC component;
   estimating means, connected to an output of said integrating means, for generating an estimate of an error in the recovered DC component;
   memory means, connected to said integrating means, for storing a restored signal output from said integrating means, wherein the restored signal includes the amplified signal and the recovered DC component; and
   means for subtracting the estimate of the error in the recovered DC component from the restored signal to produce a compensated restored signal.

6. The apparatus as defined in claim 5, wherein both said differentiating and integrating means consist of a single capacitor.

7. The apparatus as defined in claim 5, further comprising:
   an analog-to-digital converter for converting the output from said amplifying means to digital signals, and said integrating means includes means for numerically integrating the digital signals output from said analog-to-digital converter.

8. The apparatus as defined in claim 7, wherein said differentiating means and said analog-to-digital converter include a delta modulator.

9. The apparatus as defined in claim 5, wherein said estimating means includes a digital signal processor for determining the estimate of the error in the recovered DC component based on a predetermined signal pattern in the received radio signal.

10. The apparatus as defined in claim 5, wherein said estimating means includes a digital signal processor for determining the estimate of the error in the recovered DC component based on an inherent characteristic of the received radio signal.

11. A radio receiving apparatus for receiving an RF signal and applying said RF signal to first and second quadrature channels, comprising:
- a local oscillator;
- first and second mixers, associated with said first and second quadrature channels, respectively, each having one input for receiving said RF signal and a second input for receiving from said local oscillator sinusoidal signals at a carrier frequency of said RF signal;
- first and second differentiating means for respectively differentiating outputs from said first and second mixers in order to eliminate DC offset components generated by imbalances between said first and second mixers;
- first and second amplifying means for respectively amplifying outputs from said first and second differentiating means; and
- first and second integrating means for respectively integrating outputs from said first and second amplifying means to restore DC offset components of said outputs from said first and second mixers.

12. The apparatus as defined in claim 11, further comprising:
- means, connected to outputs of said first and second integrating means, for estimating errors in said restored DC offset components;
- memory means, connected to said first and second integrating means, for storing signals from said first and second integrating means; and
- means for combining said errors with said stored signals to produce an error-free output signal.

13. The apparatus as defined in claim 12, wherein said first and second differentiating means and said first and second integrating means each respectively consist of a single capacitor.

14. The apparatus as defined in claim 11, wherein said first and second differentiating means include a delta modulator for differentiating the outputs of said first and second mixers and for digitizing the differentiated outputs.

15. The apparatus as defined in claim 14, wherein said first and second integrating means include a digital signal processor for numerically integrating the outputs from said first and second amplifiers.

16. The apparatus as defined in claim 12, wherein said estimating means includes a digital signal processor for determining said errors in the restored DC offset components based on a predetermined signal pattern in the received RF signal.

17. The apparatus as defined in claim 12, wherein said estimating means includes a digital signal processor for determining said errors in the restored DC offset components based on an inherent characteristic of said received RF signal.

18. In a radio receiver, an apparatus for compensating for DC offset in a received signal, comprising:
- comparator means for comparing a received signal with a feedback signal and for generating a first digital value if said received signal exceeds said feedback signal and a second digital value if said received signal is less than said feedback signal;
- memory means for storing a sequence of digital values output from said comparator means;
- deciding means, connected to said memory means, for receiving said sequence of digital values and for deciding a current step value;
- first integrating means for integrating current step values received from said deciding means and for generating said feedback signal; and
- second integrating means for integrating said digital values received from said memory means in order to restore DC components of said received signal.

19. The apparatus according to claim 18, wherein said digital values represent the digitized derivative of said received signal.

20. The apparatus according to claim 18, wherein said second integrating means includes an up/down counter means for counting up when a first digital signal is received and down when a second digital signal is received.

21. The apparatus according to claim 18, wherein said current step values are positive and negative step values based on said sequence of digital values.

22. The apparatus according to claim 21, wherein said deciding means increases and decreases the magnitude of said positive and negative step values based on predetermined patterns in said sequence.

23. A radio receiving apparatus for receiving an RF signal and applying said RF signal to first and second quadrature channels, comprising:
- means for receiving said RF signal and separating said RF signal into first and second quadrature signals;
- first and second comparator means for comparing said first and second quadrature signals with first and second feedback signals respectively, and for generating a first digital value if said received signal exceeds said feedback signal and a second digital value if said received signal is less than said feedback signal;
- first and second memory means for storing corresponding sequences of said digital values generated by said first and second comparator means, respectively;
- first and second deciding means, connected to said first and second memory means, for receiving said sequences of digital values and for deciding a joint current step value;
- first and second integrating means for integrating joint current step values received from said deciding means and for generating said first and second feedback signals which are sent to said first and second comparator means, respectively; and
- first and second reintegrating means for reintegrating said corresponding digital values received from said first and second memory means in order to restore DC components of said received signal.

24. A radio receiver for receiving an RF signal and applying said RF signal to plural channels, comprising:
- means for receiving said RF signal and separating said RF signals into a plurality of channels signals;
- plural delta modulating means for receiving respective channel signals, each delta modulating means generating a digital output;
- plural memory means for storing digital sequences of digital outputs from corresponding ones of said plural delta modulating means;
- adaptive means, connected to said plural memory means, for adapting step value signals transmitted back to corresponding ones of said plural delta modulating means; and plural reintegrating means for integrating a corresponding digital output received from corresponding ones of said plural memory means in order to restore DC components of said channel signals.

25. The apparatus according to claim 24, wherein said step value signals are identical for each delta modulating means and any adaptation by said adaptive means is uniformly applied to said step value signals.

26. The apparatus according to claim 24, wherein each of said plural delta modulating means includes:
   comparator means for comparing a respective channel signal with a feedback signal and for generating a first digital value if said RF received signal exceeds said feedback signal and a second digital signal value if said received RF signal is less than said feedback signal in order to restore DC components of said channel signal;
   clock means for generating a clock pulse;
   latch means, connected to said clock means, for latching a sequence of digital values output from said comparator means at each clock pulse;
   deciding means, connected to said latch means, for receiving said sequence of digital values and for deciding a current step value;
   integrator means for integrating current step values received from said deciding means and for outputting said feedback signal to said comparator means.

27. A radio receiver as defined in claim 24, further comprising:
   plural means, connected to said plural reintegrating means, for estimating errors in the restored DC offset components;
   plural memory means, connected to said plural reintegrating means, respectively, for storing signals from said plural reintegrating means; and
   plural means for algebraically combining said errors in the restored DC offset components with said stored signals to produce compensated restored signals.

28. The apparatus as defined in claim 27, wherein said plural estimating means include processing means for determining said errors in the DC offset components based on a predetermined signal in said received RF signal.

29. The apparatus as defined in claim 27, wherein said estimating means include processing means for determining said errors in the DC components based on an inherent characteristic of said received RF signal.

30. A method for compensating for DC offset in a signal received in a multi-channel RF receiver, comprising:
   comparing a received signal with a feedback signal and generating a first digital value if said received signal exceeds said feedback signal and a second digital value if said received signal is less than said feedback signal;
   storing a sequence of said digital values produced in said comparing step;
   determining a current step value based on said sequence of digital values;
   integrating said current step value and generating said feedback signal; and
   reintegrating said digital values stored at said storing step in order to restore DC components of said received signal.

31. The method according to claim 30, further comprising:
   increasing the magnitude of said current step value based on predetermined patterns of said sequence.

32. The method according to claim 30, further comprising decreasing the magnitude of said current step value based on predetermined patterns of said sequence.

* * * * *